(12) United States Patent
Choong

(10) Patent No.: US 7,667,383 B2
(45) Date of Patent: Feb. 23, 2010

(54) LIGHT SOURCE COMPRISING A COMMON SUBSTRATE, A FIRST LED DEVICE AND A SECOND LED DEVICE

(75) Inventor: Vi-En Choong, Carlsbad, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 537 days.

(21) Appl. No.: 11/356,389

(22) Filed: Feb. 15, 2006

(65) Prior Publication Data

US 2007/0188086 A1   Aug. 16, 2007

(51) Int. Cl.
H05B 33/02 (2006.01)
H05B 33/14 (2006.01)
H05B 33/24 (2006.01)

(52) U.S. Cl. .................. 313/498; 313/506; 313/503

(58) Field of Classification Search .............. 313/498, 313/504, 506, 503, 489; 362/800
See application file for complete search history.

(56) References Cited

U.S. PATENT DOCUMENTS

| | | | |
|---|---|---|---|
| 5,583,350 A | 12/1996 | Norman et al. | |
| 5,703,436 A | 12/1997 | Forrest et al. | |
| 5,739,552 A | 4/1998 | Kimura et al. | |
| 5,965,907 A | 10/1999 | Huang et al. | |
| 6,060,727 A | 5/2000 | Shakuda | |
| 6,117,529 A | 9/2000 | Leising et al. | |
| 6,211,538 B1 | 4/2001 | Park | |
| 6,316,786 B1 | 11/2001 | Mueller et al. | |
| 6,329,085 B1 | 12/2001 | Burrows et al. | |
| 6,639,249 B2 | 10/2003 | Valliath | |
| 6,730,937 B2 | 5/2004 | Dai et al. | |
| 6,936,856 B2 | 8/2005 | Guenther et al. | |
| 2001/0000005 A1 | 3/2001 | Forrest et al. | |
| 2002/0006040 A1* | 1/2002 | Kamada et al. | 362/237 |
| 2002/0079834 A1 | 6/2002 | Dai et al. | |
| 2002/0135296 A1 | 9/2002 | Aziz et al. | |

FOREIGN PATENT DOCUMENTS

| | | |
|---|---|---|
| WO | WO 00/29779 A1 | 5/2000 |
| WO | WO 01/04938 A1 | 1/2001 |
| WO | WO 01/45140 A2 | 6/2001 |

OTHER PUBLICATIONS

Hebner, T.R. et al., "Ink-Jet Printing of Doped Polymers for Organic Light Emitting Devices", Applied Physics, Letters, vol. 72, No. 5, Feb. 2, 1998, pp. 519-521.
Burrows, P.E. et al., "Color-Tunable Pixels and Lasers Using Vacuum-Deposited Organic Thin Films", SPIE, vol. 3148, 0277-786X/97, pp. 252-263.
Pschenitzka, F. et al., "Three-Color Organic Emitting Diodes Patterned by Masked Dye Diffusion", Applied Physics, Letters vol. 74, No. 13, pp. 1913-1915.

* cited by examiner

*Primary Examiner*—Karabi Guharay
(74) *Attorney, Agent, or Firm*—Fish & Richardson P.C.

(57) ABSTRACT

At least one stacked organic or polymeric light emitting diode (PLEDs) devices to comprise a light source is disclosed. At least one of the PLEDs includes a patterned cathode which has regions which transmit light. The patterned cathodes enable light emission from the PLEDs to combine together. The light source may be top or bottom emitting or both.

18 Claims, 4 Drawing Sheets

LIGHT SOURCE COMPRISING A COMMON SUBSTRATE, A FIRST LED DEVICE AND A SECOND LED DEVICE

GOVERNMENT RIGHTS

This invention was made with Government support under Contract No. DE-FC26-04NT41947 awarded by the Department of Energy. The Government may have certain rights in the invention.

BACKGROUND OF THE INVENTION

A typical structure of polymer light-emitting diodes (PLEDs) consists of a hole injection electrode (anode), a layer of light-emitting polymer (LEP) and an electron injection electrode (cathode). Usually the anode layer consists of a transparent conducting film such as indium-tin-oxide (ITO) with a layer of conducting polymer, such as poly(3,4-ethylenedioxythiophene) doped with poly(styrene sulphonate) (PEDOT:PSS). The purpose of the PEDOT:PSS layer is to improve hole injection into the LEP by increasing the work function of the injection layer and providing a better physical contact between the LEP and the injection layer. The polymer layers are typically spin coated, though advanced printing methods can also be employed. The cathode layer is typically a layer of low work function metal, such as Ba or Ca, capable of effectively injecting electrons into the LEP layer, capped with a layer of another metal such as Al.

The color of light emission from such a device structure is controlled by emission properties of the LEP layer. For example, emitting polymers such as PPV and MEH-PPV emit in the green and orange, which corresponds to the band gap of the respective polymers. Broad spectrum emission such as white emission can be achieved by blending a blue-emitting LEP with polymers (or small molecules) that emit in green and red regions of spectrum. In this case direct carrier trapping and/or energy transfer from the blue host to the red and green dopants will redistribute emission between blue, green and red chromophores thus resulting in white emission. A similar approach is to synthesize a copolymer incorporating all three types of chromophores in one polymer chain thus preventing possible phase separation that may occur in a blend.

In order to optimize the PLEDs, both the device structure and material set needs to be optimized to obtain good efficiency and reliability. This is relatively simpler to do for single color emitting PLEDs than for broad spectrum PLEDS for the following reasons: (1) Since only very small concentration of the emitting dopants are required to change the color of emission, the tolerances of the concentrations of these dopants in the host LEP have to be very tight in order to have sufficient reproducibility. (2) In addition to affecting the color, changing the concentrations of the emitting dopants, or changing the dopant can also result in undesirable changes in charge transport (e.g. trapping of charges) properties of the host LEP which can adversely affect device performance. (3) The stability of these emitting chromophores in the host and in the presence of each other across the operational life of the device is also an issue as illustrated in FIG. 1. What is optimum for one emitter, is usually not optimum for the other emitters as illustrated in the degradation patterns shown in FIG. 1. An alternative to the above issues is to inkjet print the LEP layer which suffers from complicated processing issues of its own. Thus, there is a great need for a method to obtain broad spectrum PLEDs that do not suffer from the issues stated above.

DETAILED DESCRIPTION

At least one stacked organic or polymeric light emitting diode (PLEDs) devices to comprise a light source is disclosed. At least one of the PLEDs includes a patterned cathode which has regions which transmit light. The patterned cathodes enable light emission from the PLEDs to combine together. The light source may be top or bottom emitting or both.

Figure 1:
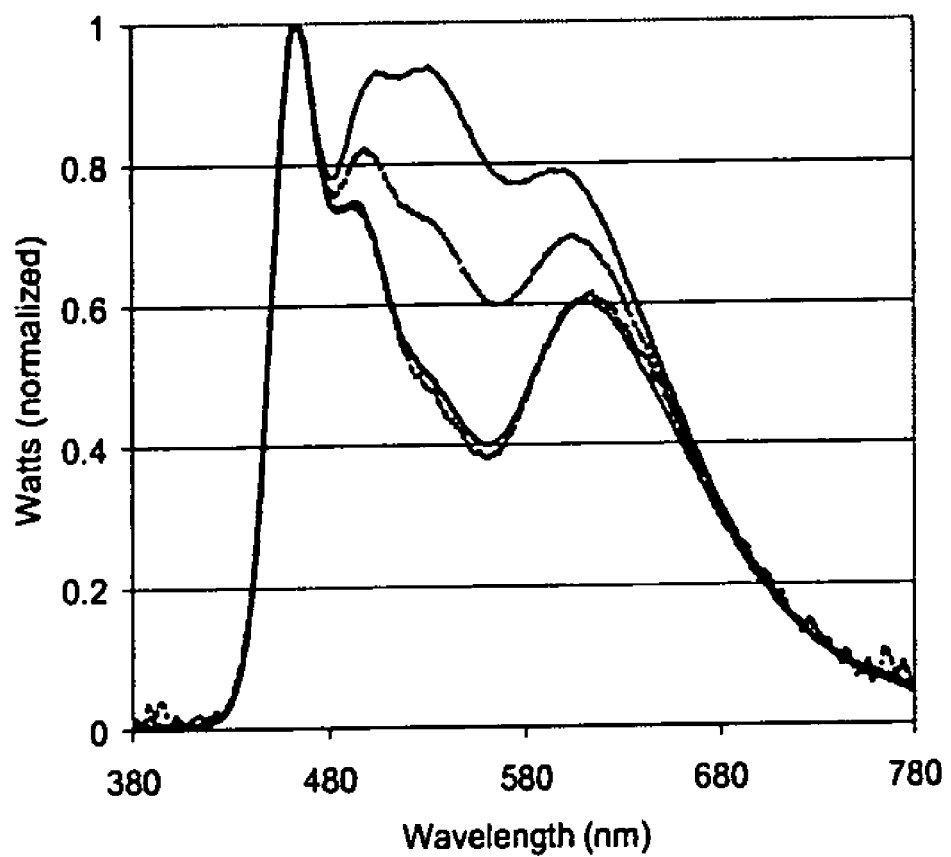
FIG. 1 illustrates lifetime and emission degradation.
Figure 2A:
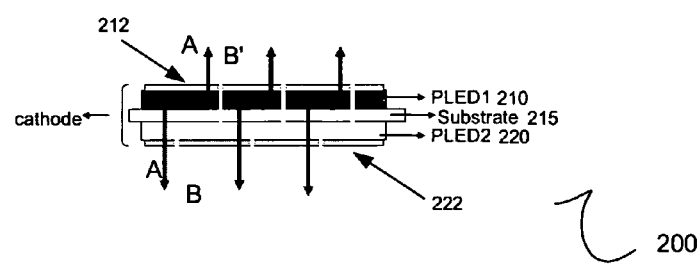
FIG. 2A shows a cross-sectional view of a first embodiment of a dual emission light source 200 according to at least one embodiment of the invention.
Figure 2B:
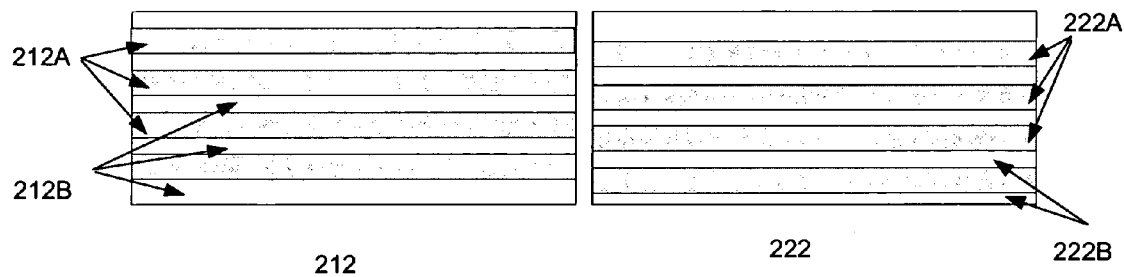
FIG. 2B is a top view of cathodes used in light source 200.

In various embodiments, disclosed is a double structure PLED, each PLED emitting in a different color (spectrum). An example of such a structure is shown in FIG. 2A. Two PLEDs are made on either side of the substrate, each emitting in different colors (spectrums) whose combination will result in white emission. Each PLED can be optimized separately to obtain maximum efficiency and reliability. Also, the relative emission intensity can be adjusted during operation to maintain color if needed. Typically, the cathode would have to be transparent in order to allow the emission to be visible. This approach would work if a transparent cathode is available which would also be good for PLED efficiency, which it currently is not. In various embodiments, this is handled by either using a transparent spacer such as SiO to pattern the cathode, or use a laser to pattern the cathode of each PLED to allow the emission through. Both methods would work, but the advantage of laser patterning is the eradication of coating issues such as pile up, which can cause inhomogeneous emission. Although a stripe pattern is shown in the diagram of FIG. 2B, it is within the scope of the invention to employ other patterns, such as Swiss cheese or mesh (FIG. 3), so as to maximize light output. Other embodiments are build the PLED on two separate substrates, then fuse the two substrates together. In another embodiment, only one of the cathodes is patterned. The other serves as a mirror to focus all emission in one direction. Another embodiment would be to physically stack up two or more completed PLEDs built on separate substrates as shown in FIG. 4 exemplary of three stacked PLEDs.

FIG. 2A shows a cross-sectional view of a first embodiment of a dual emission light source 200 according to at least one embodiment of the invention. As used within the specification and the claims, the term "on" includes when objects (e.g., layers and devices) are in physical contact and when objects are separated by one or more intervening layers. Though the various embodiments of the invention refer to PLED devices, any OLED (Organic Light Emitting Diode) device or any light source can readily be substituted as desired.

In FIG. 2A, a first PLED (polymer light emitting diode) PLED1 210 is fabricated on or disposed on one side of a common substrate 215. A second PLED PLED2 220 is fabricated on or disposed on the opposite side of common substrate 215. Thus, the same substrate, common substrate 215, is used to fabricate both PLEDs 210 and 220. PLED1 210 has a cathode 212 and PLED2 220 has a different cathode 222. Dual emission light source 200 is comprised of PLED1 210 and PLED2 220 disposed on common substrate 215. Alternatively, common substrate 215 may be the result of two individual substrates that were fused together as one substrate.

In order to allow light to pass out of dual emission light source 200, cathodes 212 and 222 may be patterned to include regions that are light transmissive (where cathode material is absent) and regions that are reflective (where cathode material is present). This patterning can be alternating or partially overlapping such that a transmissive region in cathode 212 corresponds or overlaps with a reflective region in cathode 222. One exemplary patterning of cathodes 212 and 222 is shown in FIG. 2B. Substrate 215 would, in some embodiments, be transmissive of light.

Cathode 212 is shown in FIG. 2B from a top view where the shaded regions 212A represent cathode material and the blank regions 212B represent an absence of cathode material, and specifically, such that blank regions transmit light. It is assumed also that the cathode material comprising shaded regions 212A reflects light. Likewise, cathode 222 is shown in FIG. 2B from a top view where the shaded regions 222A represent cathode material and the blank regions 222B represent an absence of cathode material, and specifically, such that blank regions transmit light. It is assumed also that the cathode material comprising shaded regions 222A reflects light. Further, assume that PLED1 210 has a active light emissive output of a spectrum A and that PLED2 220 has an active light emissive output of a spectrum B. In one more embodiments of the invention, spectra A and B are different in color output.

When both PLEDs 210 and 220 are emitting light simultaneously, the following would occur. At the shaded regions 212A, cathode 212 would reflect emission A of PLED1 210 out of common substrate 215 and toward PLED2 220. At the shaded regions 222A, cathode 222 would reflect emission B of PLED2 220 out of common substrate 215 and toward PLED1 210. At the blank regions 212B, the reflected emission B from PLED2 220 would be transmitted where there is an overlap in the vertical plane between blank regions 212B and shaded regions 222A. At the blank regions 222B, the reflected emission A from PLED1 210 would be transmitted where there is an overlap in the vertical plane between blank regions 222B and shaded regions 212A.

If the reflected emission A is A' and the reflected emission B is B', then the following spectral outputs occur. From out of the blank regions 212B, the spectral output from the light source 200 is the emission B' (the emission B as reflected from cathode 222) and the emission A (the actual emission from PLED1 210). From out of the blank regions 222B, the spectral output from the light source 200 is the emission A' (the emission A as reflected from cathode 212) and the emission B (the actual emission from PLED2 220). In most instances, the emission A' is probably the same spectrum as A, and the emission B' is probably the same as emission B. However, due to the optical path through the device 200 that the reflected emissions A' and B' take, there may be some spectral shift or intensity change or both in either one or both of the reflected emissions A' or B'. There may also be an A' emission that is reflected back by cathode 212B exiting the device where A and B' exit. The number and combination of reflected emissions is not intended to be exhaustive as one of ordinary skill in the art will appreciate that many reflections and transmissions are possible.

Figure 3:
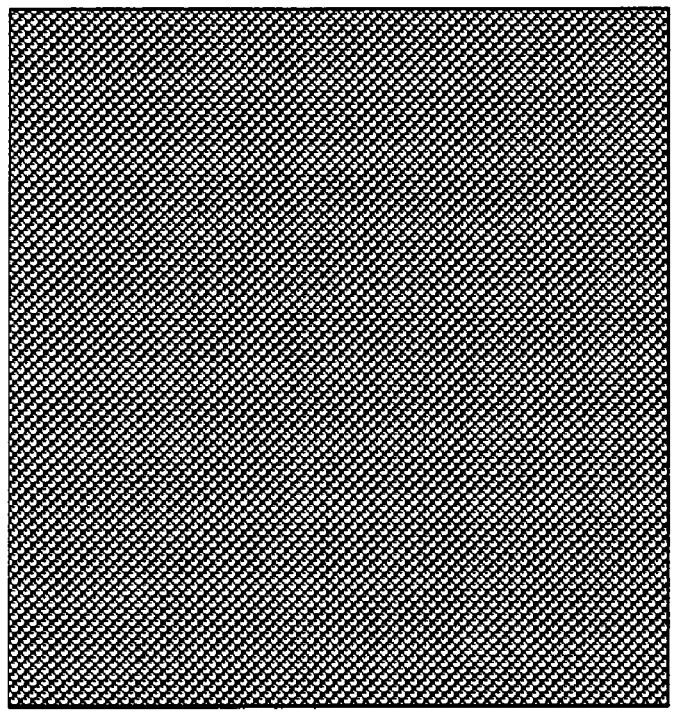
FIG. 3 illustrates a Swiss cheese pattern for cathodes in a dual emission PLED.
Figure 4:
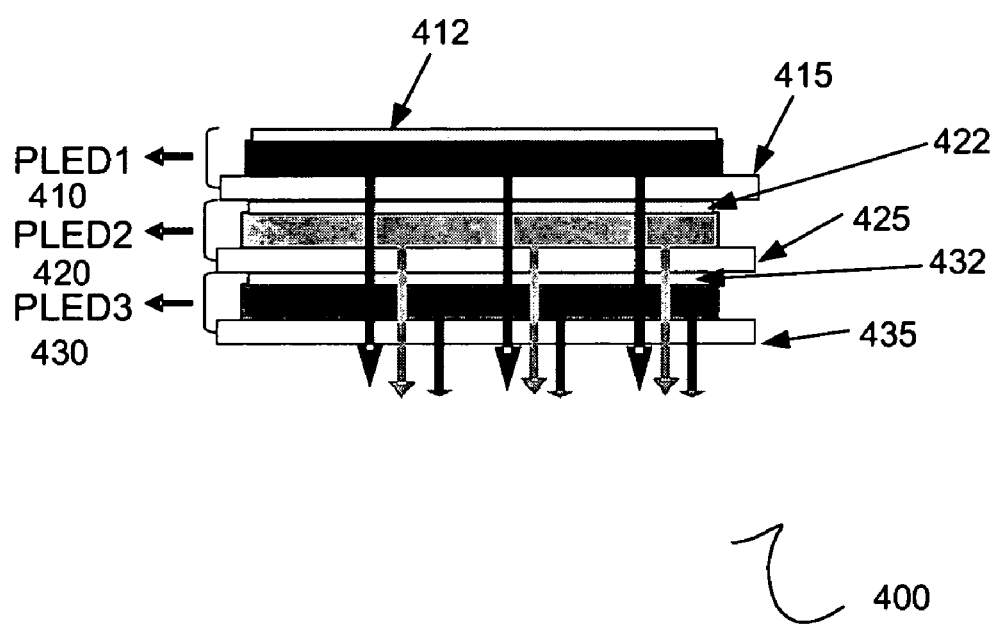
FIG. 4 illustrates an alternate embodiment of the invention in a side view of three stacked PLEDs with independent substrates.

FIG. 3 illustrates a Swiss cheese pattern for cathodes in a dual emission PLED. In the pattern of FIG. 3, the blank regions where there is an absence of cathode material and the shaded regions where cathode material is absent in circular or small pocketed regions and is surrounded by cathode material. Such a pattern can be achieved by ablating, corrosive deposition or by punching holes into a cathode layer. Many alternate cathode patterns are possible and will depend on design choice and ease of manufacture.

FIG. 4 illustrates an alternate embodiment of the invention in a side view of three stacked PLEDs with independent substrates. A PLED1 410 has a cathode 412 and a substrate 405. Disposed over PLED1 410 is a PLED2 420 having a cathode 422 and a substrate 425. Disposed over PLED2 420 is a PLED3 430 having a cathode 432 and a substrate 435. Assume that, in isolation, PLED1 410 has an emission spectrum D, PLED2 420 has an emission spectrum E, and PLED3 430 has an emission spectrum F. In at least one embodiment of the invention, cathode 412 does not contain blank regions, but only reflective regions so that all light incident thereto reflects back. The cathode 422 may be patterned to include regions of cathode material which reflects light and regions without cathode material ("blank") which transmit light. Alternatively, cathode 422 can be fully light transmissive if a suitable transmissive cathode material can be found. The cathode 432 may be patterned to include regions of cathode material which reflects light and regions without cathode material ("blank") which transmit light. Alternatively, cathode 432 can be fully light transmissive if a suitable transmissive cathode material can be found. In at least one embodiment, the substrates 415, 425 and 435 are fully transmissive of light.

The light source 400 comprises the combination of PLED1 410, PLED2 420 and PLED3 430. The total light emission of light source 400 is output through substrate 435 of PLED3 430. The total light emission of light source 400 is a combination of the emissions generated by PLED1 410, PLED2 420 and PLED3 430. This combination of emissions comprises the aforementioned spectra D, E and F and reflections of these spectra which travel through various pathways in device 400. The specific reflected emissions which are produced will depend upon the patterning structure of cathodes 422 and 432 as well as any transformations due to the pathway in which they travel. One of skill in the art can optimize the patterns of cathodes 422 and 432 to produce the desired emission.

In addition, each of the PLEDs 410, 420 and 430 can be individually optimized and designed and may comprise of different materials and different kinds of layers. Furthermore, each may emit in one or more different colors. For instance, PLED1 410 may emit in red, PLED2 420 may emit in green and PLED3 430 may emit in blue, such that the total output emission of light source 400 approximates a white emission spectrum.

Suitable PLEDs

The PLEDs suitable for use in various embodiments of the invention include any organic light emitting diode devices, including those using polymer, small-molecule, monomer, or inorganic materials. There is no limitation or restriction on the type/kind/structure of the devices used PLEDs, and the phrase "PLEDs", as used herein, refers broadly to any class of light emitting devices, both polymer and non-based.

Suitable Substrates:

The substrate(s) can be any material, which can support the layers of the PLEDs, and is transparent or semi-transparent to the wavelength of light generated in the device. The substrate can be transparent or opaque (e.g., the opaque substrate is used in top-emitting devices). By modifying or filtering the wavelength of light which can pass through the substrate, the color of light emitted by the device can be changed. Preferable substrate materials include glass, quartz, silicon, and plastic, preferably, thin, flexible glass. The preferred thickness of the substrate depends on the material used and on the application of the device. The substrate can be in the form of a sheet or continuous film. The continuous film is used, for example, for roll-to-roll manufacturing processes which are particularly suited for plastic, metal, and metallized plastic foils.

Suitable Cathodes:

The cathode of the PLEDs is a conductive layer which serves as an electron-injecting layer and which typically comprises a material with a low work function. While the cathode can be comprised of many different materials, preferable materials include aluminum, silver, magnesium, calcium, barium, or combinations thereof. More preferably, the cathode is comprised of aluminum, aluminum alloys, or combinations of magnesium and silver. The cathode is preferably comprised of light reflective or partially light reflective materials.

As mentioned above, the cathodes used in at some of the embodiments of the invention may be patterned to include "blank" regions which are light transmissive. The blank regions can be fabricated by ablating a cathode film, by masking and depositing cathode material around the mask to create a pattern or by separating strips or regions of cathode material with a transparent spacer comprising, for instance, plastic, glass, quartz, $SiO_2$ or any translucent material.

As any person of ordinary skill in the art of organic electronic device fabrication will recognize from the description, figures, and examples that modifications and changes can be made to the embodiments of the invention without departing from the scope of the invention defined by the following claims.

What is claimed:

1. A light source, comprising:
   a common substrate;
   a first light emitting diode (LED) device on a first side of said substrate; and
   a second light emitting diode (LED) device on a side opposing said first side of said substrate, said first LED device emitting light of spectrum A and said second LED device emitting light of spectrum B, wherein said first LED device comprises a patterned cathode having regions of cathode material which reflect light and regions without cathode material which transmit light.

2. The light source of claim 1 wherein said second LED device comprises a patterned cathode having regions of cathode material which reflect light and regions without cathode material which transmit light.

3. The light source of claim 2 wherein the regions of cathode material of said first patterned cathode align in part with the regions without cathode material of said second cathode.

4. The light source of claim 3 wherein for said first and second cathodes, said regions of cathode material and regions without cathode material alternate in stripes.

5. The light source of claim 2 wherein said regions of cathode material and regions without cathode material alternate in stripes.

6. The light source of claim 2 wherein said regions of cathode material and regions without cathode material form a Swiss cheese pattern.

7. The light source of claim 3 wherein for said first and second cathodes, said regions of cathode material and regions without cathode material form a Swiss cheese pattern.

8. The light source of claim 2 wherein said regions without cathode material comprise glass, plastic, quartz, silicon or a translucent material.

9. The light source of claim 2, wherein:
   the regions without cathode material in the first patterned cathode are configured to transmit light generated in the first LED device of spectrum A and light of spectrum B';
   the regions without cathode material of the second patterned cathode transmit light generated by the second LED device of spectrum B and light of spectrum A'; and
   spectrum A is different from spectrum A' and spectrum B is different from spectrum B'.

10. The light source of claim 1 wherein said first LED device and said second LED device include at least one of a polymer material, a monomer material, a small molecule material or an inorganic material.

11. The light source of claim 1 wherein said regions of cathode material and regions without cathode material alternate in stripes.

12. The light source of claim 1 wherein said regions of cathode material and regions without cathode material form a Swiss cheese pattern.

13. The light source of claim 1 wherein said common substrate results from fusing substrates of said first LED device and said second LED device together.

14. The light source of claim 1 wherein said common substrate includes at least one of glass, plastic, quartz, silicon, or a translucent material.

15. The light source of claim 1 wherein said common substrate is fabricated by fusing together two individual substrates.

16. The light source of claim 1 wherein said regions without cathode material comprise glass, plastic, quartz, silicon or a translucent material.

17. The light source of claim 1, wherein the regions without cathode material have a transparent spacer therein, wherein the transparent spacer comprises plastic, glass, quartz or silicon dioxide.

18. The light source of claim 1, wherein the substrate is semi-transparent to the emitted light generated in the first LED device and/or the second LED device.

* * * * *